US006762432B2

(12) United States Patent
Rumsey

(10) Patent No.: US 6,762,432 B2
(45) Date of Patent: Jul. 13, 2004

(54) ELECTRICAL FIELD ALIGNMENT VERNIER

(75) Inventor: Robert W. Rumsey, Campbell, CA (US)

(73) Assignee: Micrel, Inc., San Jose, CA (US)

(*) Notice: Subject to any disclaimer, the term of this patent is extended or adjusted under 35 U.S.C. 154(b) by 164 days.

(21) Appl. No.: 10/114,707

(22) Filed: Apr. 1, 2002

(65) Prior Publication Data

US 2003/0186133 A1 Oct. 2, 2003

(51) Int. Cl.[7] .............................................. H01L 23/58
(52) U.S. Cl. ....................................................... 257/48
(58) Field of Search ................................. 257/48, 620

(56) References Cited

U.S. PATENT DOCUMENTS 6,399,400 B1 * 6/2002 Osann et al. ................. 438/14

6,680,484 B1 * 1/2004 Young ........................... 257/48

* cited by examiner

*Primary Examiner*—Roy Potter
(74) *Attorney, Agent, or Firm*—Patent Law Group LLP; David C. Hsia

(57) ABSTRACT

A test structure pattern includes a first comb having a first set of tines, and a second comb having a second set of tines of the same width and spacing as the first set of tines. When the test structure pattern is stepped between fields on a wafer, the first comb and the second comb at least partially overlap on photoresist over a scribe lane between the fields. When the photoresist is developed, the overlap of the first comb and the second comb generates a metal comb. Electrical continuity is checked for the metal tines of the metal comb to determine the misalignment of the fields.

8 Claims, 8 Drawing Sheets

ELECTRICAL FIELD ALIGNMENT VERNIER

FIELD OF THE INVENTION

This invention relates to test structure patterns used in semiconductor manufacturing, and in particular to test structure patterns used to determine the field-to-field alignment of a stepper in a lithographic process.

DESCRIPTION OF RELATED ART

Photomasks are an integral component in the lithographic process of semiconductor manufacturing. Semiconductor manufacturers use photomasks to optically transfer (e.g., print) images of devices (e.g., integrated circuits) onto semiconductor wafers. A lithography tool called stepper projects light through the photomask to print the image of one or more devices onto a field on a silicon wafer coated with photoresist. The stepper then moves (e.g., steps) the wafer and the image is exposed once again onto another field on the wafer. This process is repeated for the entire wafer surface. When using a positive photoresist, the exposed portions of the photoresist are removed so areas of the wafer underneath can either be etched to form channels or be deposited with other materials. This process can be reversed using a negative photoresist where the unexposed portions of the photoresist are removed.

FIG. 1 illustrates a path 102 of a stepper on a wafer 100 coated with photoresist. The stepper prints the image of one or more devices on fields 200-1, 200-2 ... 200-j ... 200-m on wafer 100, where "j" and "m" are variables.

FIG. 2 illustrates that each field partially overlaps neighboring fields in scribe lanes (also called "scribe streets" or "scribe lines") where a dicing tool cuts to separate the fields. For example, the left edge of field 200-1 and the right edge of field 200-2 overlap in scribe lanes 202 and 210, the lower edge of field 200-1 and the upper edge of field 200-7 overlap in scribe lanes 208 and 210, and the lower left corner of field 200-1 and the upper right corner of field 200-6 overlap in scribe lane 210. Similarly, the upper edge of field 200-6 and the lower edge of field 200-2 overlap in scribe lanes 204 and 210, and the right edge of field 200-6 and the left edge of field 200-7 overlap in scribe lanes 206 and 210.

In lithography, field-to-field alignment of the stepper is critical because it impacts all future masking alignments, wafer sort, and ultimately the assembly process. If the field alignment is poor, it directly impacts sort yield and assembly yield. The assembly process can be halted if the field-to-field alignment is so poor that the dicing tool cuts into the production die and damages the die and itself. By quantifying the amount of misalignment, steppers that need maintenance may be detected before they damage or destroy product wafers.

Thus, what is needed is a production friendly, field-to-field alignment tool that allows the ability to rapidly and accurately measure and quantify the field-to-field alignment.

SUMMARY OF THE INVENTION

In one embodiment of the invention, a test structure pattern includes a first comb having a first set of tines, and a second comb having a second set of tines of the same width and spacing as the first set of tines. When the test structure pattern is stepped between fields on a wafer, the first comb and the second comb at least partially overlap on photoresist over a scribe lane between the fields. When the photoresist is developed, the overlap of the first comb and the second comb generates a metal comb. Electrical continuity is checked for the metal tines of the metal comb to determine the amount of misalignment of the fields.

DETAILED DESCRIPTION

Figure 1:
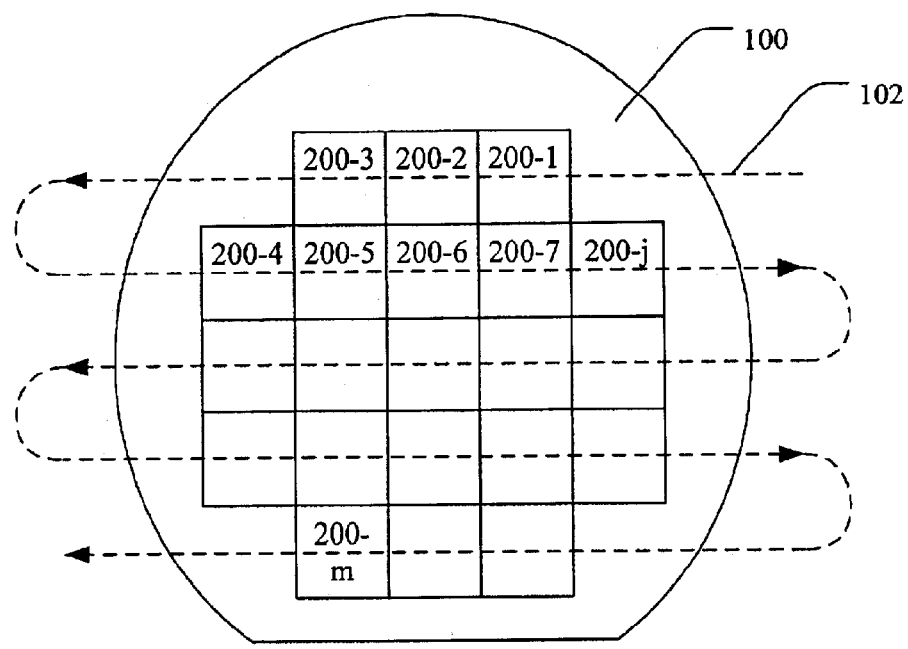
FIG. 1 illustrates a conventional path of a stepper in photolithography.
Figure 2:
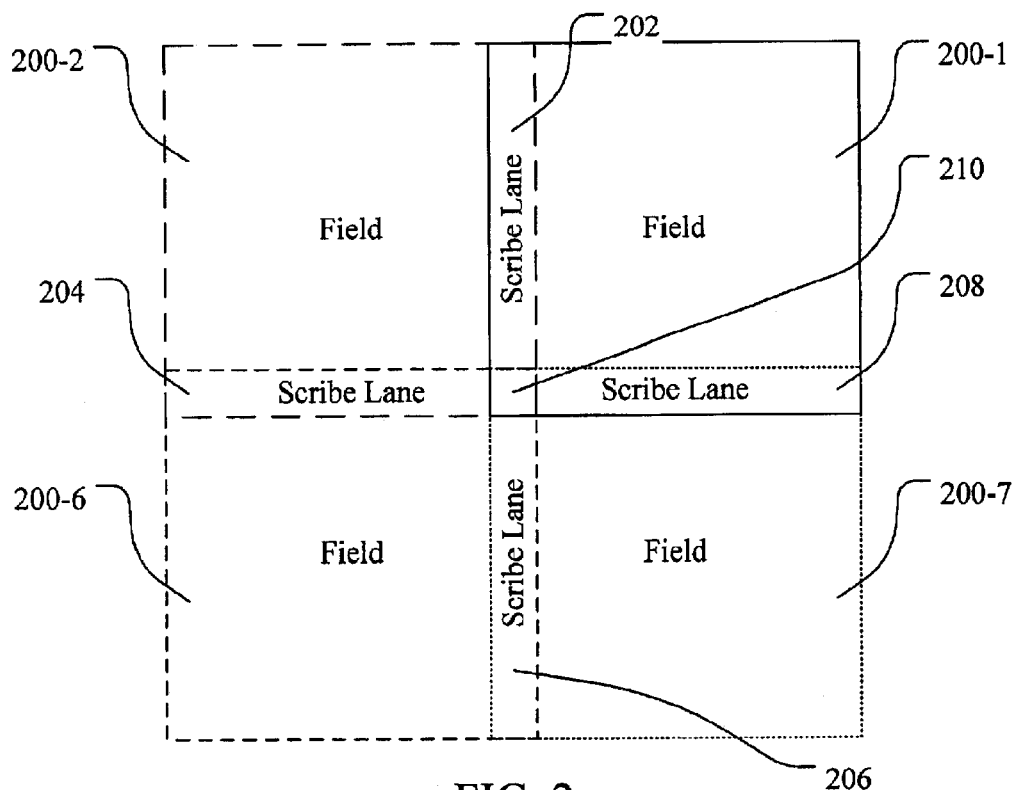
FIG. 2 illustrates a number of conventional fields with overlapping scribe lane so n a wafer.
Figure 3:
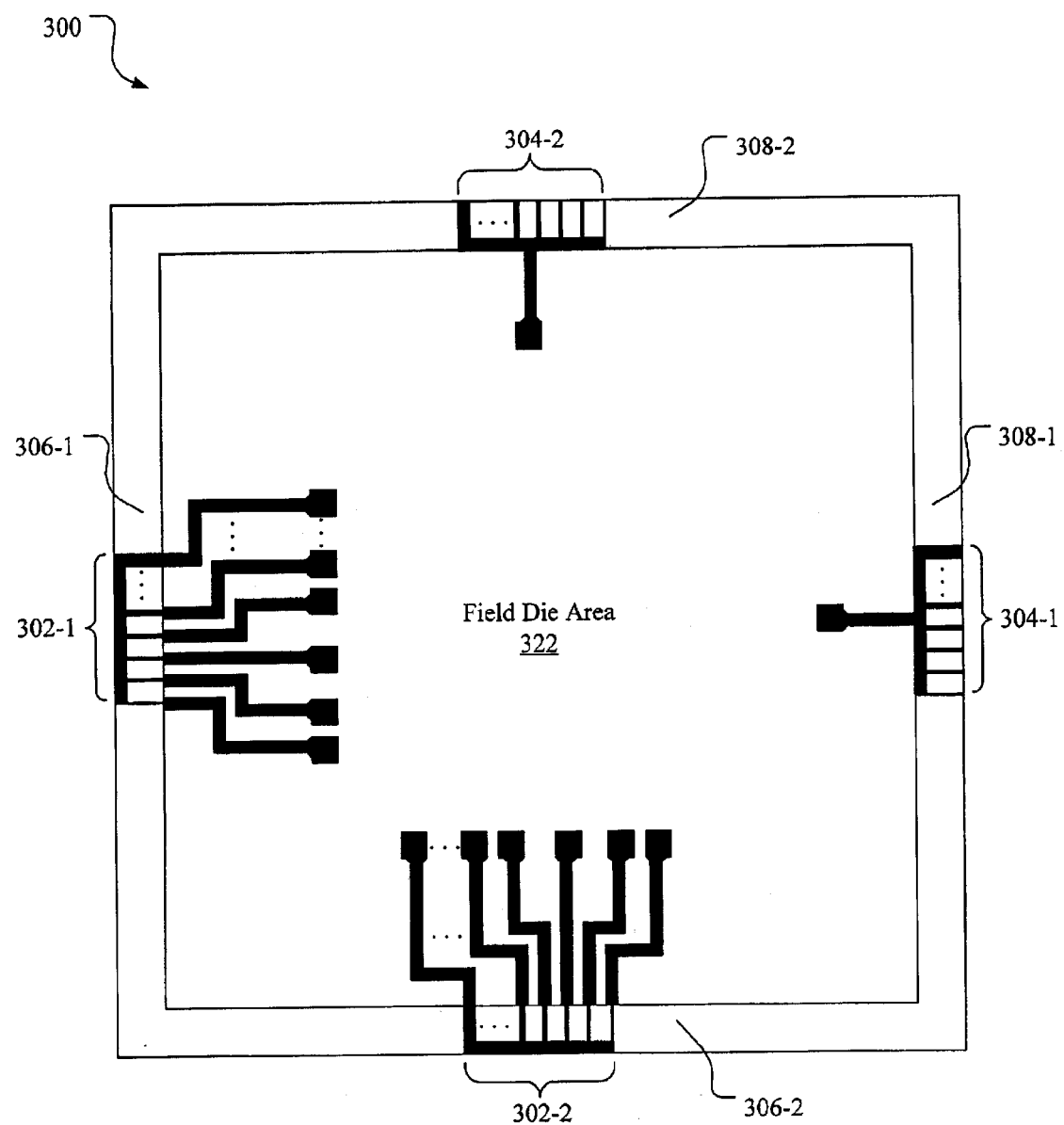
FIG. 3 illustrates a top view of test structure patterns on a photomask used with positive photoresist in accordance with one embodiment of the invention.

FIG. 3 illustrates a photomask 300 for use with positive photoresist in one embodiment of the invention. Photomask 300 includes two sets of test structure patterns. Each set of test structure patterns includes a send comb 302-i and a receive comb 304-i, where "i" is a variable. Send comb 302-i and receive comb 304-i are mirrored in opposing scribe lanes 306-i and 308-i. Specifically, (1) a first set of test structure patterns includes (a) an opaque send comb 302-1 on a left scribe 306-1 and (b) an opaque receive comb 304-1 on a right scribe 308-1, and (2) a second set of test structure patterns includes (a) an opaque send comb 302-2 on a lower scribe 306-2 and (b) an opaque receive comb 304-2 on an upper scribe 308-2.

Figure 4:
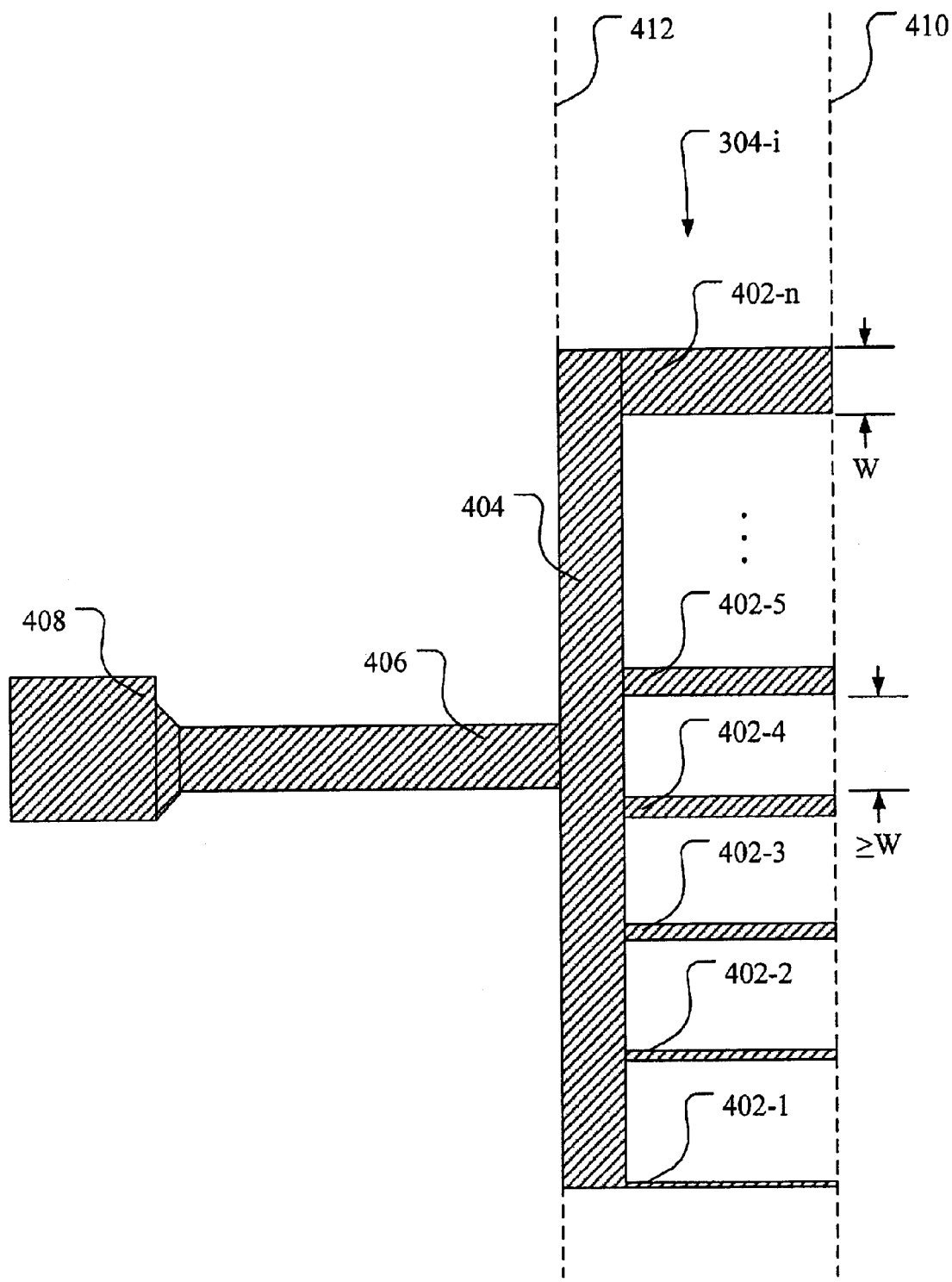
FIG. 4 illustrates an enlarged view of a receive comb of FIG. 3 in one embodiment of the invention.

FIG. 4 illustrates a receive comb 304-i in one embodiment. Dashed lines 410 and 412 delineate the respective outward and inward boundaries of scribe 308-i. Receive comb 308-i includes parallel tines 402-1, 402-2, 402-3, 402-4, 402-5, ..., and 402-n, where "n" is a variable (collectively as "tines 402"). In one embodiment, send comb 304-i includes fifteen (15) tines 402 of different widths that increment from 1 micron to 6 microns in 0.5 micron steps, and then from 7 to 10 microns in 1 micron steps. Tines 402-1 to 402-11 are spaced apart by 6 microns while tines 402-11 to 402-15 are spaced apart by 10 microns. In other embodiments, tines 402 could be of other widths and spacing to detect a specific misalignment range. Tines 402 are coupled to a common line 404 that runs across the inward ends of tines 402. A line 406 couples line 404 to a single bond pad 408.

Figure 5:
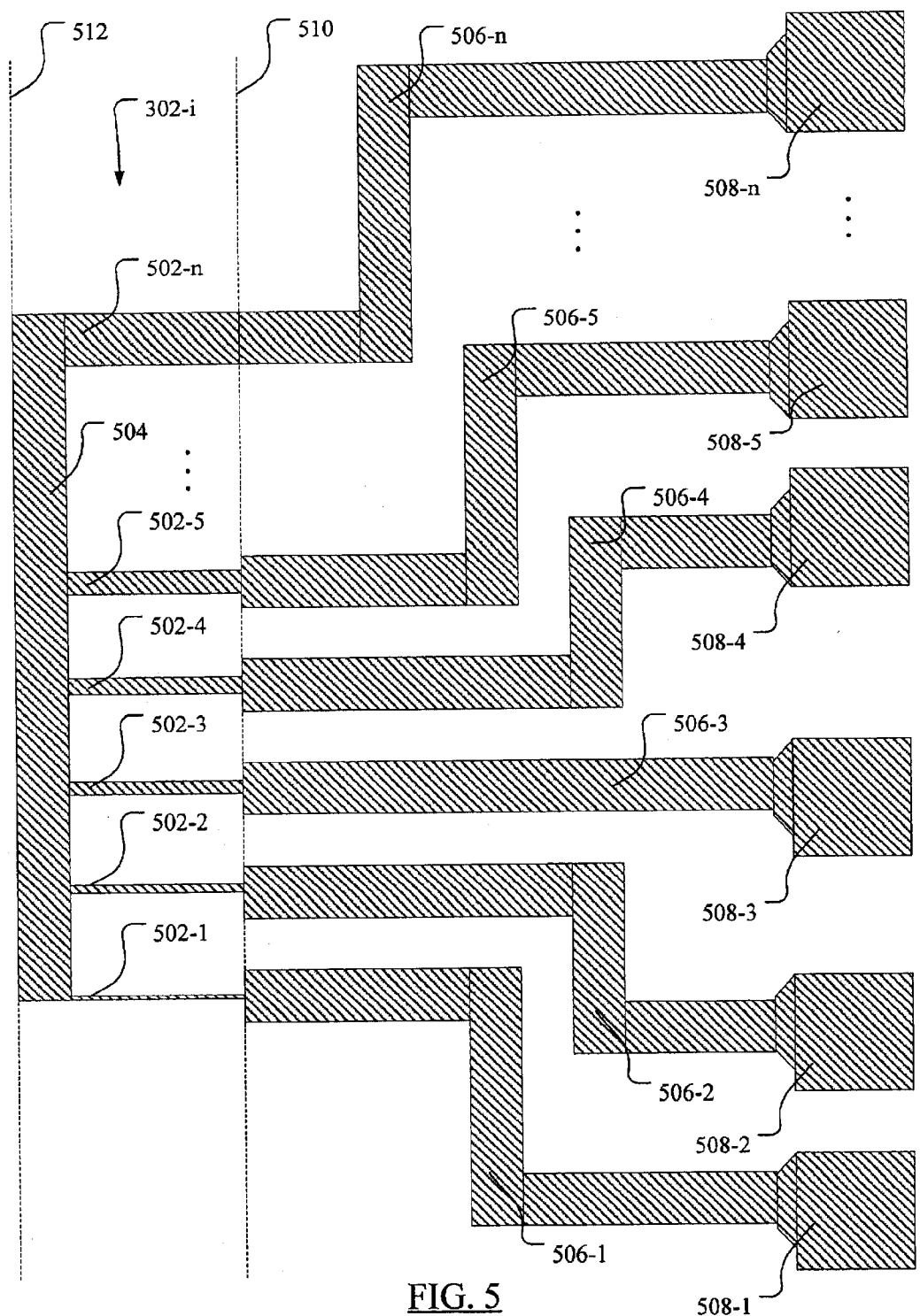
FIG. 5 illustrates an enlarge view of a send comb of FIG. 3 in one embodiment of the invention.

FIG. 5 illustrates a send comb 302-i in one embodiment. Dashed lines 510 and 512 delineate the respective inward and outward boundaries of scribe 306-*i*. Similar to receive comb 304-*i*, send comb 302-*i* includes parallel tines 502-1, 502-2, 502-3, 502-4, . . . , and 502-*n* (collectively as "tines 502"). In one embodiment, tines 402 and 502 have the same number and widths. Tines 502 are individually coupled to respective lines 506-1, 506-2, 506-3, 506-4, 506-5, . . . , and 506-*n* (collectively as "lines 506"). Lines 506 are individually coupled to bond pads 508-1, 508-2, 508-3, 508-4, 508-5, . . . , and 508-*n* (collectively as "bond pads 508") so tines 502 may be individually probed. In one embodiment, each of lines 506 has at least the same width as the tine that it is coupled to. To maintain a mirror image of receive comb 304-*i*, send comb 302-*i* also includes a common line 504 that runs across the outward ends of tines 502.

Figure 6:
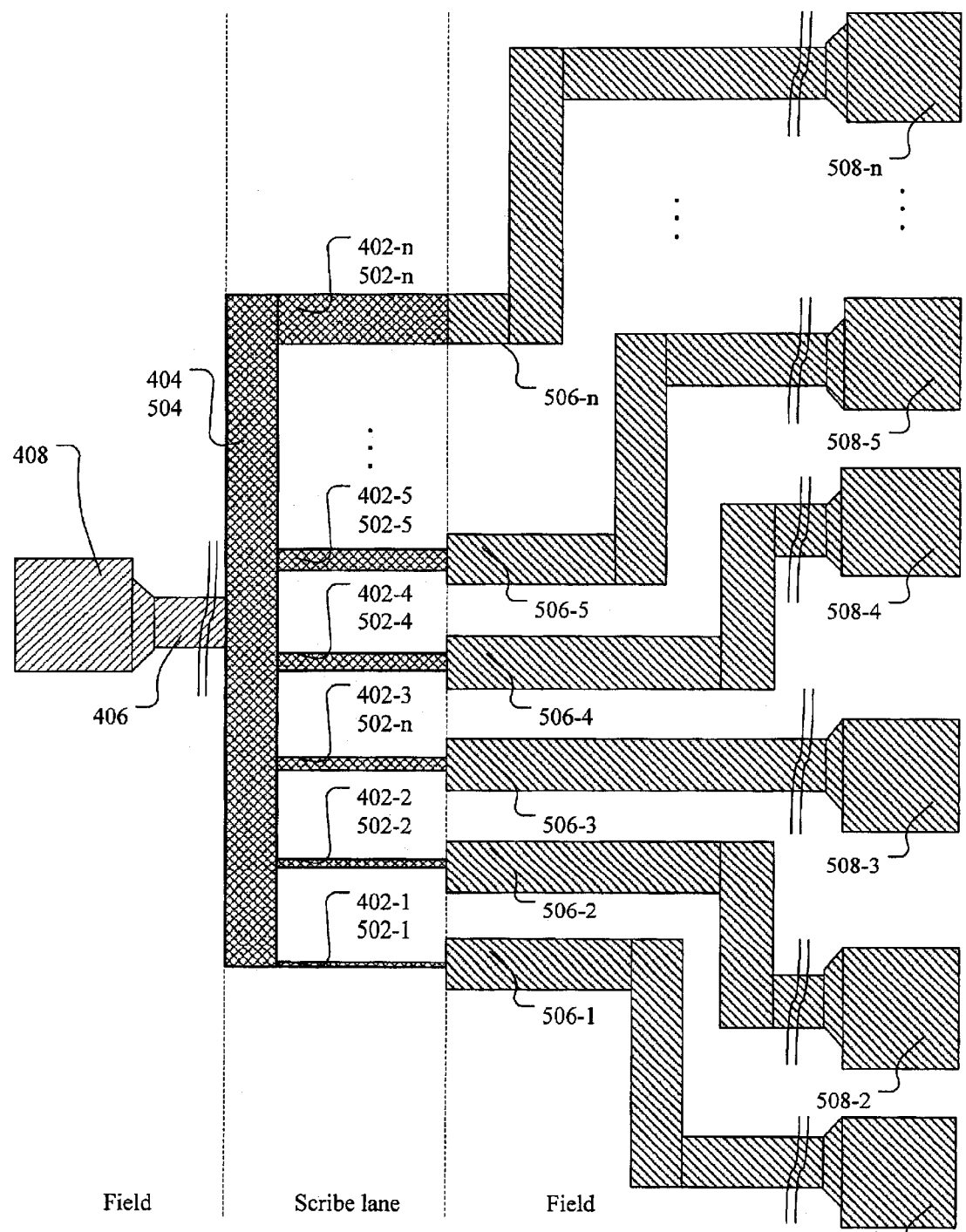
FIG. 6 illustrates a top view of the overlap of the send comb and received comb after the photomask is stepped through neighboring fields in one embodiment of the invention.

In embodiments of the invention, photoresist is formed atop a conductive layer on a wafer. As described above, opposing scribes overlap on a scribe lane between fields on the wafer when a stepper moves photomask 300 between the fields. FIG. 6 illustrates that tines 502 and line 504 of send comb 302-*i* at least partially overlap respective tines 402 and line 404 of receive comb 304-*i* (or vice versa) in the scribe lane if the stepper has accurately placed and aligned the fields. In FIG. 6, send comb 302-*i* and receive comb 304-*i* are shaded by lines of two different orientations while the overlap of send comb 302-*i* and receive comb 304-*i* are shaded by lines of both orientations. Thus, areas of the photoresist under (1) the overlap of tines 402 and 502 and (2) the overlap of lines 404 and 504 are left unexposed.

Figure 7:
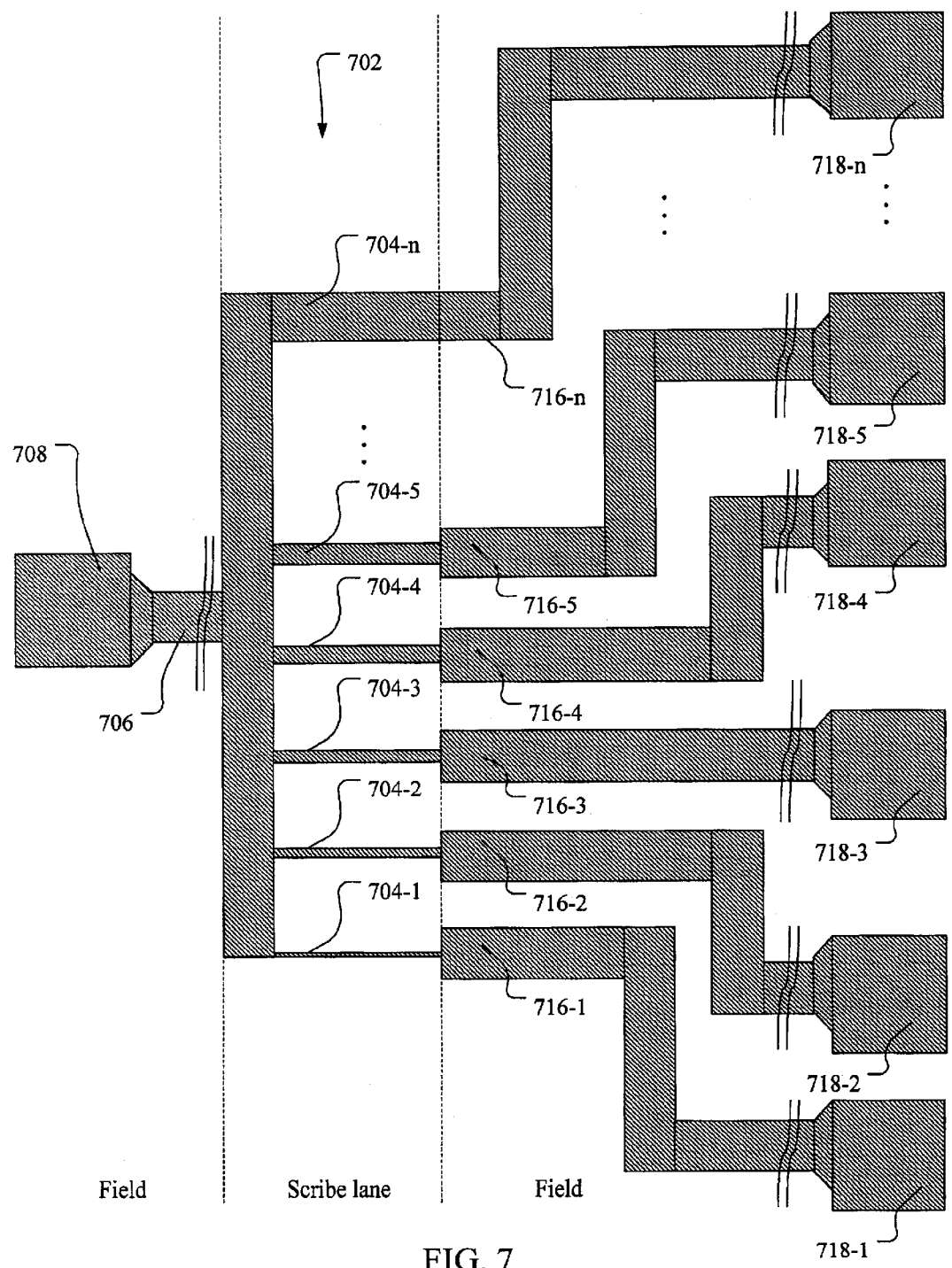
FIG. 7 illustrates a test structure generated on the photoresist form exposure to the send comb and the receive comb with an aligned stepper in one embodiment of the invention.

FIG. 7 illustrates the resulting structure from the pattern of FIG. 6 when the photoresist is developed and the conductive layer is etched. The overlap of tines 402 and 502, and the overlap of lines 404 and 504, form a metal comb 702 in the scribe lane. Metal comb 702 includes unbroken metal tines 704-1 to 704-*n* (collectively as "metal tines 704"). Line 406 and bond pad 408 respectively form a metal line 706 and a bond pad 708 on a first of two adjacent fields. Lines 506 and bond pads 508 respectively form metal lines 716-1 to 716-*n* and metal bond pads 718-1 to 718-*n* (collectively as "metal bond pads 718") on a second of two adjacent fields. When a current is supplied to each of metal bond pads 718, continuity is established at metal bond pad 708 because each of metal tines 704 is unbroken.

Figure 8:
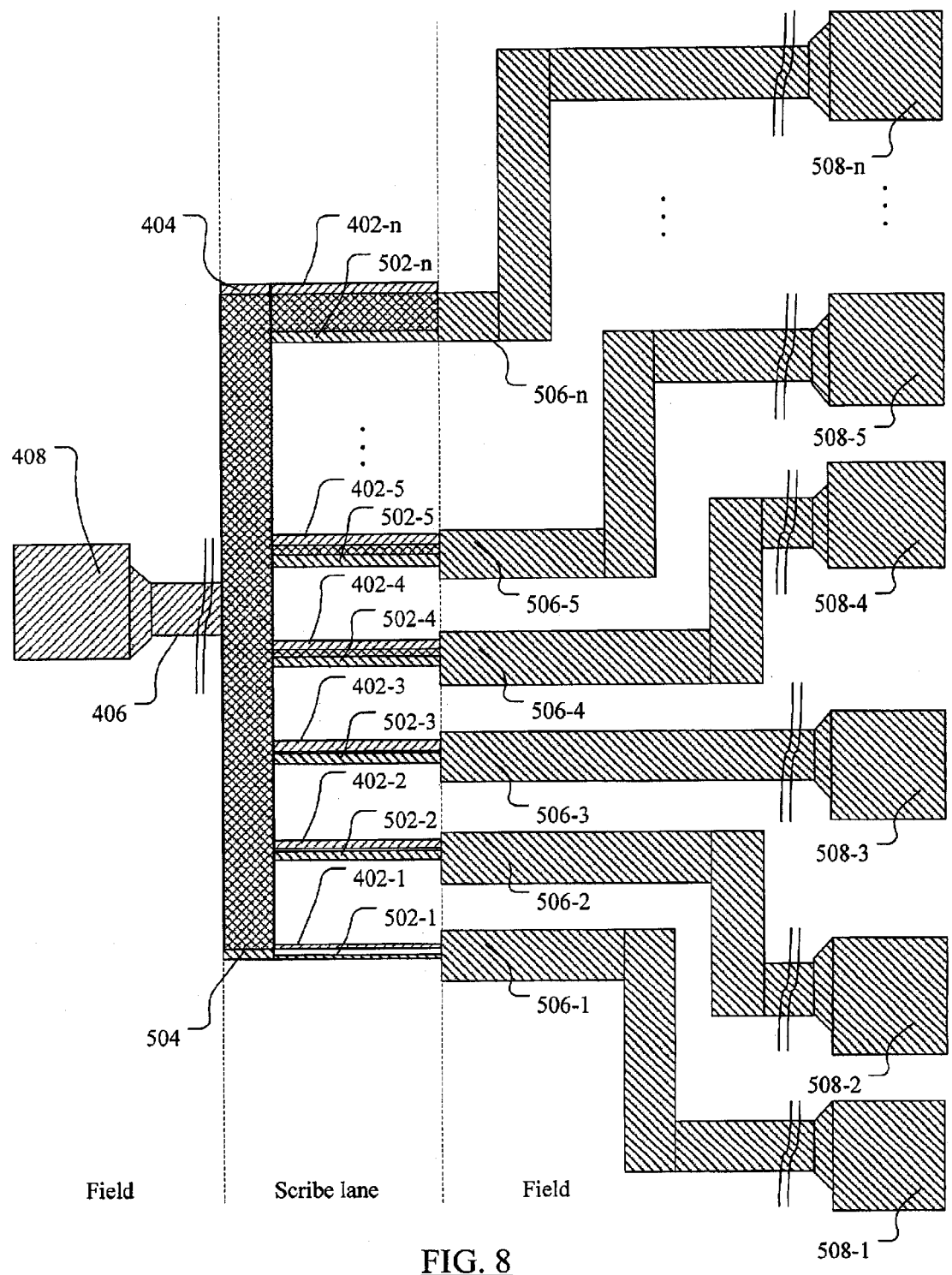
FIG. 8 illustrates a top view of the non-overlap of the send comb and received comb after the photomask is stepped through neighboring fields in one embodiment of the invention.

FIG. 8 illustrates that some of tines 502 and line 504 of send comb 302-*i* do not partially overlap the corresponding tines 402 and line 404 of receive combs 304-*i* in the scribe lane (or vice versa) if the stepper has not accurately placed and aligned the fields. In FIG. 8, send comb 302-*i* and receive comb 304-*i* are shaded by lines of two different orientations while the overlap of send comb 302-*i* and receive comb 304-*i* are shaded by lines of both orientations. The misalignment of send comb 302-*i* and receive combs 304-*i* causes light to land on the non-overlapping areas masked only by send comb 302-*i* or receive comb 304-*i*. As previously described, areas of photoresist under (1) the overlap of tines 402 and 502 and (2) the overlap of lines 404 and 504 are unexposed. However, the non-overlapping areas will have the conducting layer underneath etched off.

Figure 9:
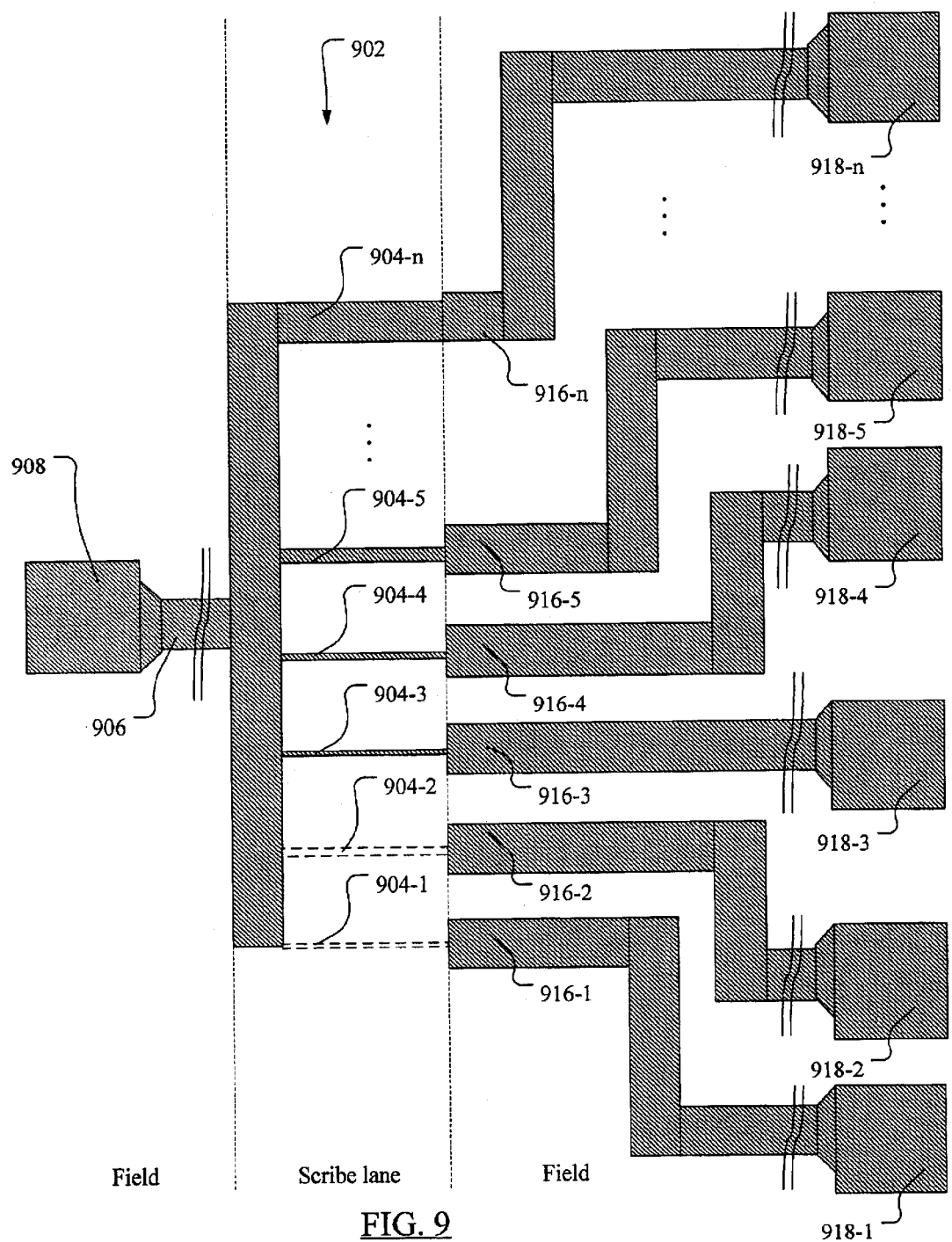
FIG. 9 illustrates a test structure generated on the photoresist form exposure to the send comb and the receive comb with a misaligned stepper in one embodiment of the invention.

FIG. 9 illustrates the resulting structure from the pattern of FIG. 8 when the photoresist is developed and the conductive layer is etched. The overlap of tines 402 and 502, and the overlap of lines 404 and 504, form a metal comb 902 in the scribe lane. Metal comb 902 includes broken or missing metal tines 904-1 and 904-2 (shown with dashed lines), and unbroken metal tines 904-3 to 904-*n*. Line 406 and bond pad 408 respectively form a metal line 906 and a metal bond pad 908 on a first of two adjacent fields. Lines 506 and bond pads 508 respectively form metal lines 916-1 to 916-*n* and metal bond pads 918-1 to 918-*n* (collectively as "metal bond pads 918") on a second of two adjacent fields. When a current is supplied to one of the metal bond pads 918, continuity is not established at metal bond pad 908 if a corresponding metal tine is broken.

A probe card can be used to probe the resulting metal combs and record electrical continuity for each tine. The width of the smallest tines of send comb 302-*i* and receive comb 304-*i* that generate a metal tine at which electrical continuity is recorded represents the largest amount of misalignment for that field in a direction perpendicular to the tines. For example, the fields of FIG. 9 are aligned within a dimension equal to the width of tine 402-3 of send comb 302-*i* and tine 502-3 of receive comb 304-*i*.

Various other adaptations and combinations of features of the embodiments disclosed are within the scope of the invention. As understood by one skilled in the art, the concepts discussed herein can be implemented with a photomask used with negative photoresist where the transmission characteristics are reversed. Numerous embodiments are encompassed by the following claims.

What is claimed is:

1. A test structure pattern, comprising:

a first scribe comprising a first comb, the first comb comprising a first plurality of tines;

a pad coupled in parallel to the first plurality of tines;

a second scribe comprising a second comb, the second comb comprising a second plurality of tines of same widths and spacing as the first plurality of tines; and a plurality of pads coupled individually to the second plurality of tines.

2. The test structure pattern of claim 1, wherein the test structure pattern is stepped between fields on a wafer and the first scribe and the second scribe at least partially overlap on a scribe lane between the fields so the first comb and the second comb at least partially overlap.

3. The test structure pattern of claim 1, wherein the first plurality of tines and the second plurality of tines each comprises tines of incrementing width.

4. The test structure pattern of claim 1, wherein the first plurality of tines are spaced apart at least by the width of the largest tine of the first plurality of tines, and the second plurality of tines are spaced apart at least by the width of the largest tine of the second plurality of tines.

5. The test structure pattern of claim 1, further comprising a plurality of lines that couple the second plurality of tines to the plurality of pads, the plurality of lines each having the width of at least the width of the tine it is coupled to.

6. The test structure pattern of claim 1, wherein the width of one of the first plurality of tines is equal to a critical dimension, and the width of one of the second plurality of tines is equal to the critical dimension.

7. The test structure pattern of claim 1, further comprising a field region, wherein the first scribe is located along a first edge of the field region and the second scribe is located along an opposite edge of the field region.

8. The test structure pattern of claim 1, wherein the first comb and the second comb are opaque patterns.

* * * * *